(12) United States Patent
Endo

(10) Patent No.: US 8,796,113 B2
(45) Date of Patent: Aug. 5, 2014

(54) LASER PROCESSING METHOD FOR WAFER

(75) Inventor: Tomohiro Endo, Ota-Ku (JP)

(73) Assignee: Disco Corporation, Tokyo (JP)

( * ) Notice: Subject to any disclaimer, the term of this patent is extended or adjusted under 35 U.S.C. 154(b) by 197 days.

(21) Appl. No.: 13/483,996

(22) Filed: May 30, 2012

(65) Prior Publication Data

US 2012/0309169 A1    Dec. 6, 2012

(30) Foreign Application Priority Data

Jun. 1, 2011    (JP) .................................. 2011-123532

(51) Int. Cl.
*H01L 21/78*    (2006.01)
*H01L 21/46*    (2006.01)
*H01L 21/301*   (2006.01)

(52) U.S. Cl.
CPC ...................................... *H01L 21/78* (2013.01)
USPC ............................ 438/463; 438/462; 438/460

(58) Field of Classification Search
CPC .............................. H01L 21/268; H01L 21/78
USPC ......................................... 438/460, 462, 463
See application file for complete search history.

(56) References Cited

U.S. PATENT DOCUMENTS

| 7,005,317 | B2 | 2/2006 | Chin et al. |
| 7,544,588 | B2* | 6/2009 | Genda ........................... 438/462 |
| 8,211,781 | B2* | 7/2012 | Saito et al. .................... 438/458 |
| 2007/0023691 | A1* | 2/2007 | Morishige et al. ......... 250/492.1 |
| 2007/0293021 | A1* | 12/2007 | Yoshikawa .................... 438/463 |
| 2009/0197351 | A1 | 8/2009 | Morikazu |
| 2010/0317172 | A1* | 12/2010 | Morikazu ..................... 438/463 |
| 2011/0104835 | A1* | 5/2011 | Nihei et al. .................... 438/28 |

FOREIGN PATENT DOCUMENTS

JP           10-305420    11/1998

* cited by examiner

*Primary Examiner* — Luan C Thai
(74) *Attorney, Agent, or Firm* — Greer Burns & Crain Ltd.

(57) ABSTRACT

A processing method for a wafer on which a plurality of devices are formed and partitioned by scheduled division lines includes a dividing groove by irradiating a laser beam of a wavelength to which the wafer has absorbency along the scheduled division lines to form dividing grooves which are to be used as start points of division. An external force divides the wafer into individual devices. The dividing grooves are formed by irradiating a laser beam of a first energy which is comparatively low upon a selected scheduled division line to form a first dividing groove which is to be used as a start point of division, and irradiating another laser beam of a second energy which is higher than the first energy upon scheduled division lines other than the selected scheduled division line to form second dividing grooves which are to be used as start points of division.

2 Claims, 7 Drawing Sheets

LASER PROCESSING METHOD FOR WAFER

BACKGROUND OF THE INVENTION

1. Field of the Invention

This invention relates to a laser processing method for a wafer for processing a wafer such as a semiconductor wafer or an optical device wafer using a laser beam.

2. Description of the Related Art

A wafer such as a silicon wafer or a sapphire wafer having a plurality of devices such as ICs, LSIs or LEDs formed on a surface thereof partitioned by scheduled division lines is divided into individual devices by a processing apparatus, and the divided devices are utilized widely in various electric apparatus such as portable telephone sets or personal computers. For the division of a wafer, a dicing method which uses a cutting apparatus called dicer is adopted widely. In the dicing method, a cutting blade of a thickness of approximately 30 μm formed from abrasive grain of diamond or the like solidified with metal or resin is rotated at a speed as high as approximately 30,000 rpm while being moved to cut into a wafer to cut and divide the wafer into individual devices.

Meanwhile, in recent years, a method has been proposed in which a pulse laser beam of a wavelength with regard to which a wafer has absorbency is irradiated upon the wafer to form laser processing grooves (dividing grooves) and external force is applied to the wafer along the laser processing grooves by a breaking apparatus to divide the wafer into individual devices (refer to, for example, Japanese Patent Laid-Open No. Hei 10-305420). By the formation of laser processing grooves by the laser processing apparatus, the processing speed can be increased in comparison with the dicing method by a dicer and even a wafer made of a material having a high hardness such as sapphire or SiC can be processed comparatively readily. Further, since the processing grooves can be formed with a small width of, for example, 10 μm or less, the number of devices to be taken per one wafer can be increased in comparison with the case in which the dicing method is used for processing.

In processing of a wafer by a laser processing apparatus, a wafer is adhered to a dicing tape which is adhered at an outer peripheral portion thereof to an annular frame such that the wafer is supported on the annular frame through the dicing tape. Then, a laser beam is irradiated upon the wafer in a state in which the wafer is sucked to and held by a chuck table of the laser processing apparatus through the dicing tape.

SUMMARY OF THE INVENTION

However, there is a problem that, if the diameter of a wafer such as an optical device wafer in which an epitaxial layer is laminated on a substrate for crystal growth such as a sapphire substrate becomes as great as approximately 150 mm, then if dividing grooves (laser processing grooves) to be used as start points of division are formed on scheduled division lines, then when a wafer having dividing grooves formed thereon is carried out from a laser processing apparatus or when a wafer is transported to the dividing apparatus, due to the self-weight of the wafer, the magnitude of the moment by the large-sized wafer and so forth, the wafer is induced in a crystal orientation without along the dividing grooves and is broken.

Therefore, it is an object of the present invention to provide a laser processing method for a wafer which can prevent break of a wafer of a large diameter when the wafer is carried out from a laser processing apparatus or when the wafer is transported to a dividing apparatus after laser processing grooves are formed on the wafer.

In accordance with an aspect of the present invention, there is provided a processing method for a wafer having a surface on which a plurality of devices are formed and partitioned by scheduled division lines, including a dividing groove formation step of irradiating a laser beam of a wavelength with regard to which the wafer has absorbency along the scheduled division lines to form dividing grooves which are to be used as start points of division, and a dividing step of applying external force to the wafer on which the plural dividing grooves are formed to divide the wafer into individual devices. The dividing groove formation step includes a scheduled division line selection step of selecting a scheduled division line which partitions the plural devices as a block, a first dividing groove formation step of irradiating a laser beam of first energy which is comparatively low upon the selected scheduled division line to form a first dividing groove which is to be used as a start point of division, and a second dividing groove formation step of irradiating another laser beam of second energy which is higher than the first energy upon scheduled division lines other than the selected scheduled division line to form second dividing grooves which are to be used as start points of division.

With the processing method for a wafer of the present invention, even if a dividing groove (laser processing groove) which is to be used as a start point of division is formed on a scheduled division line of a large-diameter wafer having a diameter of approximately 150 mm, when the wafer is carried out from a laser processing apparatus, or when the wafer is transported to a dividing apparatus, the wafer can be prevented from being broken.

The above and other objects, features and advantages of the present invention and the manner of realizing them will become more apparent, and the invention itself will best be understood, from a study of the following description and appended claims with reference to the attached drawings showing a preferred embodiment of the invention.

DETAILED DESCRIPTION OF THE PREFERRED EMBODIMENT

Figure 1:
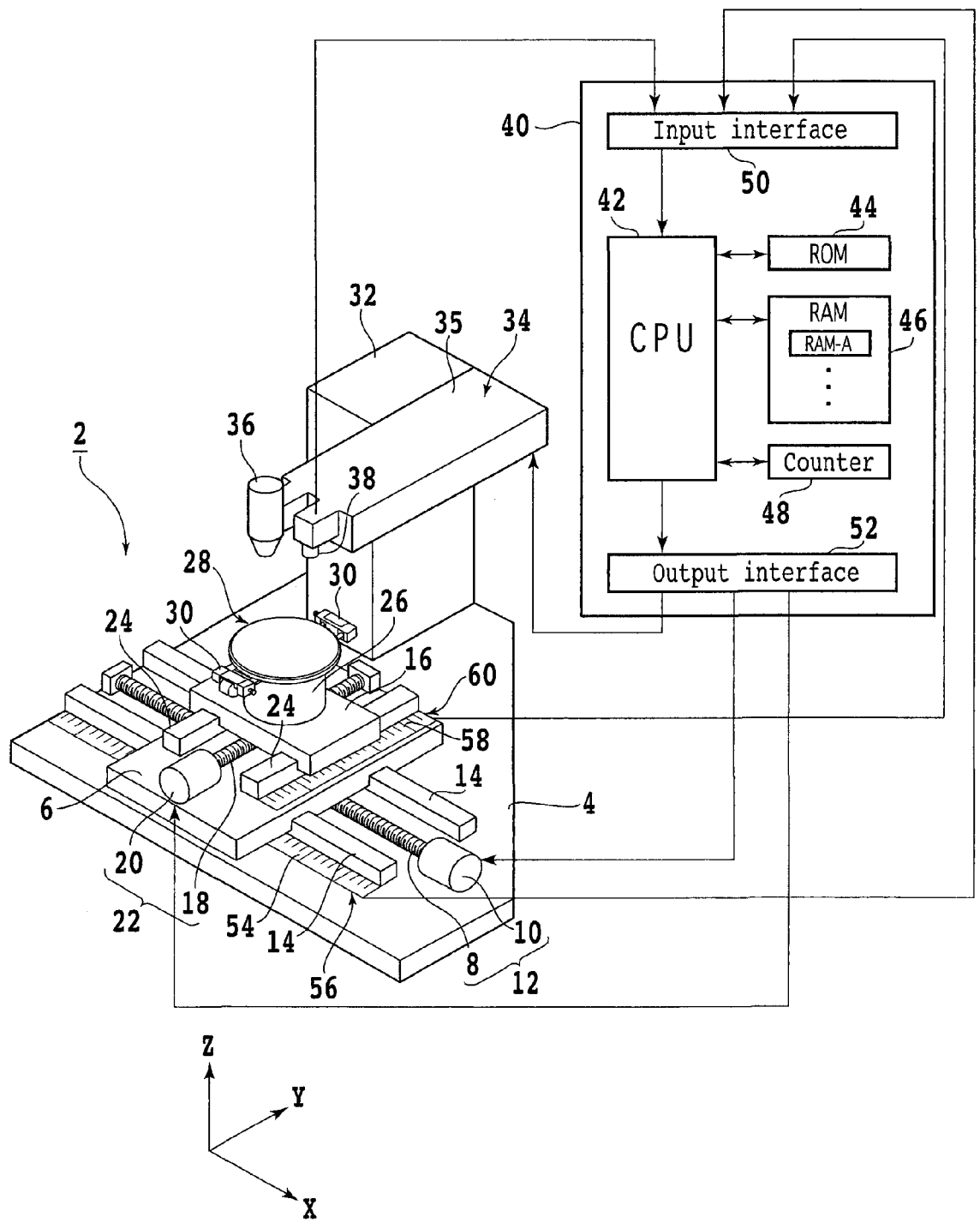
FIG. 1 is a perspective view of a laser processing apparatus suitable to carry out a processing method for a wafer of the present invention.

In the following, an embodiment of the present invention is described in detail with reference to the drawings. FIG. 1 shows a schematic configuration diagram of a laser processing apparatus 2 suitable for carrying out a processing method for a wafer of the present invention. The laser processing apparatus 2 includes a first slide block 6 mounted for movement in an X-axis direction on a stationary base 4. The first slide block 6 is moved in a processing feeding direction, that is, in the X-axis direction, along a pair of guide rails 14 by processing feeding means 12 configured from a ball screw 8 and a step motor 10.

A second slide block 16 is mounted for movement in a Y-axis direction on the first slide block 6. In particular, the second slide block 16 is moved in an indexing direction, that is, in the Y-axis direction, along a pair of guide rails 24 by indexing feeding means 22 configured from a ball screw 18 and a step motor 20. A chuck table 28 is mounted on the second slide block 16 with a cylindrical support member 26 interposed therebetween and can be moved in the X-axis direction and the Y axis direction by the processing feeding means 12 and the indexing feeding means 22. A clamp 30 for clamping a wafer sucked to and held by the chuck table 28 is provided on the chuck table 28.

Figure 2:
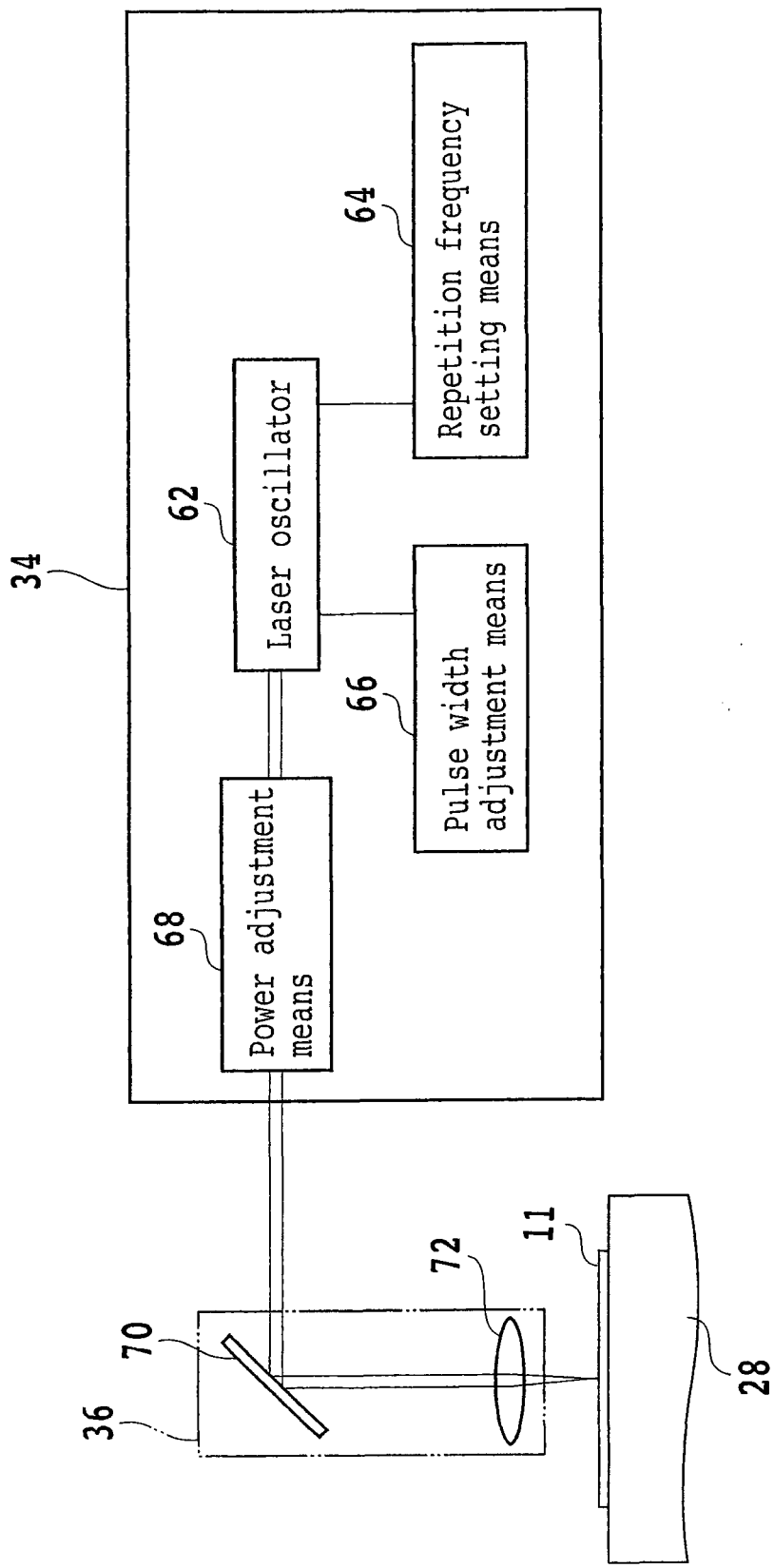
FIG. 2 is a block diagram of a laser beam irradiation unit.

A column 32 is provided uprightly on the stationary base 4, and a casing 35 for accommodating a laser beam irradiation unit 34 is attached to the column 32. The laser beam irradiation unit 34 includes, as shown in FIG. 2, a laser oscillator 62 for oscillating a YAG laser or a YVO4 laser, a repetition frequency setting means 64, a pulse width adjustment means 66, and a power adjustment means 68. A pulse laser beam whose power is adjusted to a predetermined power by the power adjustment means 68 of the laser beam irradiation unit 34 is reflected by a mirror 70 of a condenser 36 attached to an end of the casing 35, condensed by a condensing objective lens 72 and irradiated upon an optical device wafer 11 held on the chuck table 28.

At an end portion of the casing 35, an image pickup means 38 for detecting a processing region to be laser processed is disposed in alignment with the condenser 36 in the X-axis direction. The image pickup means 38 includes an image pickup element such as an ordinary CCD for picking up an image of the processing region of the optical device wafer 11 using visible light. The image pickup means 38 further includes an infrared irradiation means for irradiating infrared rays on the optical device wafer 11, an optical system for catching the infrared rays irradiated by the infrared irradiation means, and an infrared image pickup means configured from an infrared image pickup element such as an infrared CCD which outputs an electric signal corresponding to the infrared rays caught by the optical system. An image signal obtained by the image pickup is transmitted to a controller (control means) 40.

The controller 40 is configured from a computer and includes a central processing unit (CPU) 42 for carrying out an arithmetic operation process in accordance with a control program, a read only memory (ROM) 44 for storing the control program and so forth, a readable and writable random access memory (RAM) 46 for storing an arithmetic operation result and so forth, a counter 48, an input interface 50, and an output interface 52.

Reference numeral 56 denotes a processing feed amount detection means configured from a linear scale 54 disposed along the guide rails 14 and a reading head not shown disposed on the first slide block 6. A detection signal of the processing feed amount detection means 56 is inputted to the input interface 50 of the controller 40. Reference numeral 60 denotes an indexing feed amount detection means configured from a linear scale 58 disposed along the guide rails 24 and a reading head not shown disposed on the second slide block 16, and a detection signal from the indexing feed amount detection means 60 is inputted to the input interface 50 of the controller 40. Also an image signal obtained by image pickup by the image pickup means 38 is inputted to the input interface 50 of the controller 40. Meanwhile, from the output interface 52 of the controller 40, control signals are outputted to the step motor 10, step motor 20, laser beam irradiation unit 34 and so forth.

Figure 3:
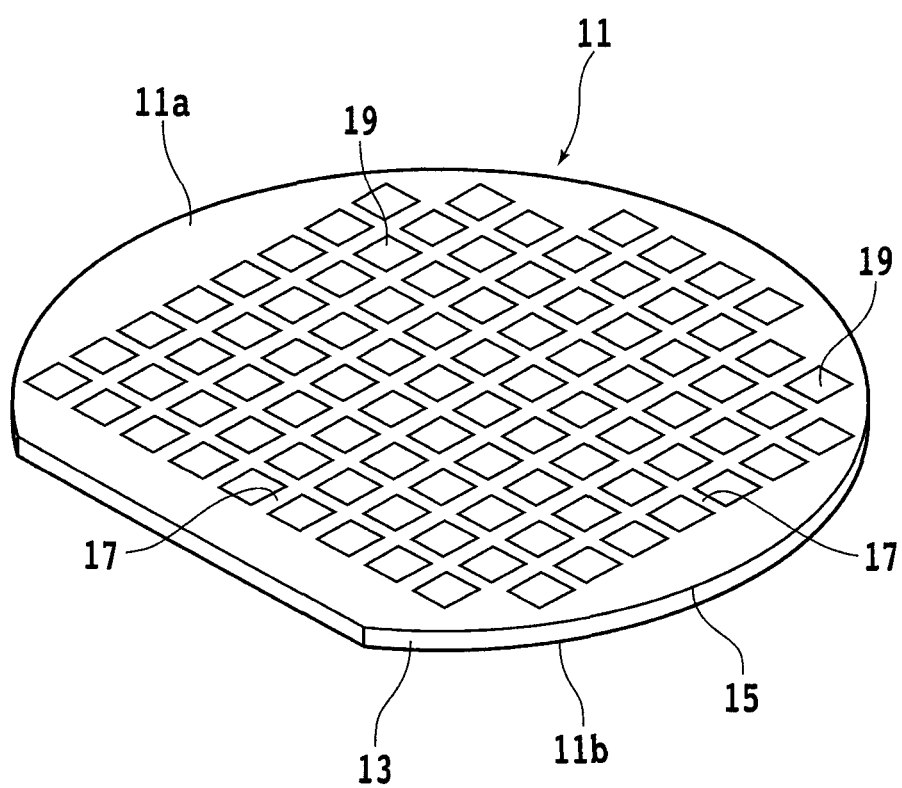
FIG. 3 is a front face side perspective view of an optical device wafer.

Referring to FIG. 3, there is shown a front face side perspective view of the optical device wafer 11 used as a processing object of the processing method of the present invention. The optical device wafer 11 is configured by laminating an epitaxial layer (semiconductor layer) 15 of gallium nitride (GaN) or the like on a sapphire substrate 13. The optical device wafer 11 has a front face 11a on which the epitaxial layer 15 is laminated, and a reverse face 11b to which the sapphire substrate 13 is exposed. The sapphire substrate 13 has a thickness of, for example, 100 μm, and the epitaxial layer 15 has a thickness of, for example, 5 μm. The epitaxial layer 15 has a plurality of optical devices 19 such as LEDs formed thereon and partitioned by scheduled division lines (streets) 17 formed in a lattice pattern.

Figure 4:
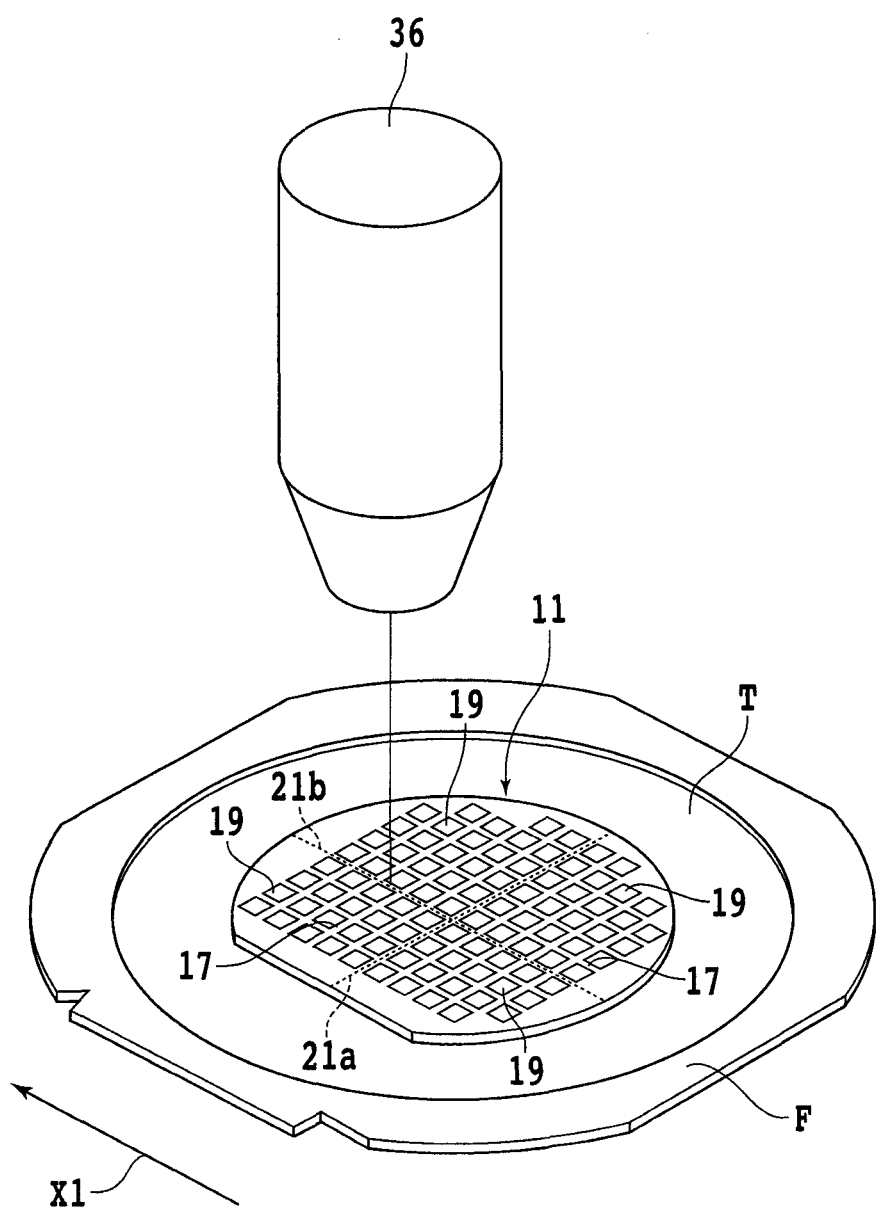
FIG. 4 is a perspective view illustrating a first dividing groove formation step.

When laser processing is to be carried out for the optical device wafer 11, as shown in FIG. 4, the optical device wafer 11 is adhered at the reverse face 11b thereof to a dicing tape T, which is an adhesive tape, and the dicing tape T is adhered at an outer peripheral portion thereof to an annular frame F. Consequently, the optical device wafer 11 is placed in a state in which it is supported on the annular frame F through the dicing tape T. In carrying out the laser processing, the optical device wafer 11 is sucked to and held by the chuck table 28 through the dicing tape T, and the annular frame F is clamped and secured by the clamp 30.

In the processing method for a wafer of the present invention, an image of the processing region of the optical device wafer 11 is picked up by the image pickup means 38 and an image process such as pattern matching for carrying out positioning of the condenser 36 of the laser beam irradiation unit 34 for irradiating a laser beam and a street 17 extending in a first direction is executed to carry out alignment of a laser beam irradiation position. Then, the chuck table 28 is rotated by 90 degrees and alignment between a street 17 extending in a second direction perpendicular to the first direction and the condenser 36 is carried out.

After the alignment is carried out, a scheduled division line selection step of selecting a scheduled division line 17 which partitions a plurality of optical devices 19 as one block is carried out. In the present embodiment, at the scheduled division line selection step, a scheduled division line 17 at a middle position is selected from among the plural scheduled division lines 17 extending in the first direction, and then a scheduled division line 17 at a middle position is selected from among the plural scheduled division lines 17 extending in the second direction perpendicular to the first direction. By this scheduled division line selection step, the optical device wafer 11 is partitioned into four blocks.

After the scheduled division line selection step is carried out, a pulse laser beam of a wavelength with regard to which the optical device wafer 11 has absorbency is irradiated with first energy which is comparatively low upon the selected scheduled division line 17 extending in the first direction through the condenser 36, and the chuck table 28 is moved at a predetermined processing feed speed in a direction indicated by an arrow mark X1 to form a first dividing groove (laser processing groove) 21a along the selected scheduled division line 17. Then, the chuck table 28 is rotated by 90 degrees. A similar laser beam is irradiated upon the selected scheduled division line 17 extending in the second direction, and the chuck table 28 is moved at a predetermined processing feed speed in the direction indicated by the arrow mark X1 to form a first dividing groove (laser processing groove) 21b along the selected scheduled division line 17 extending in the second direction.

Figure 5:
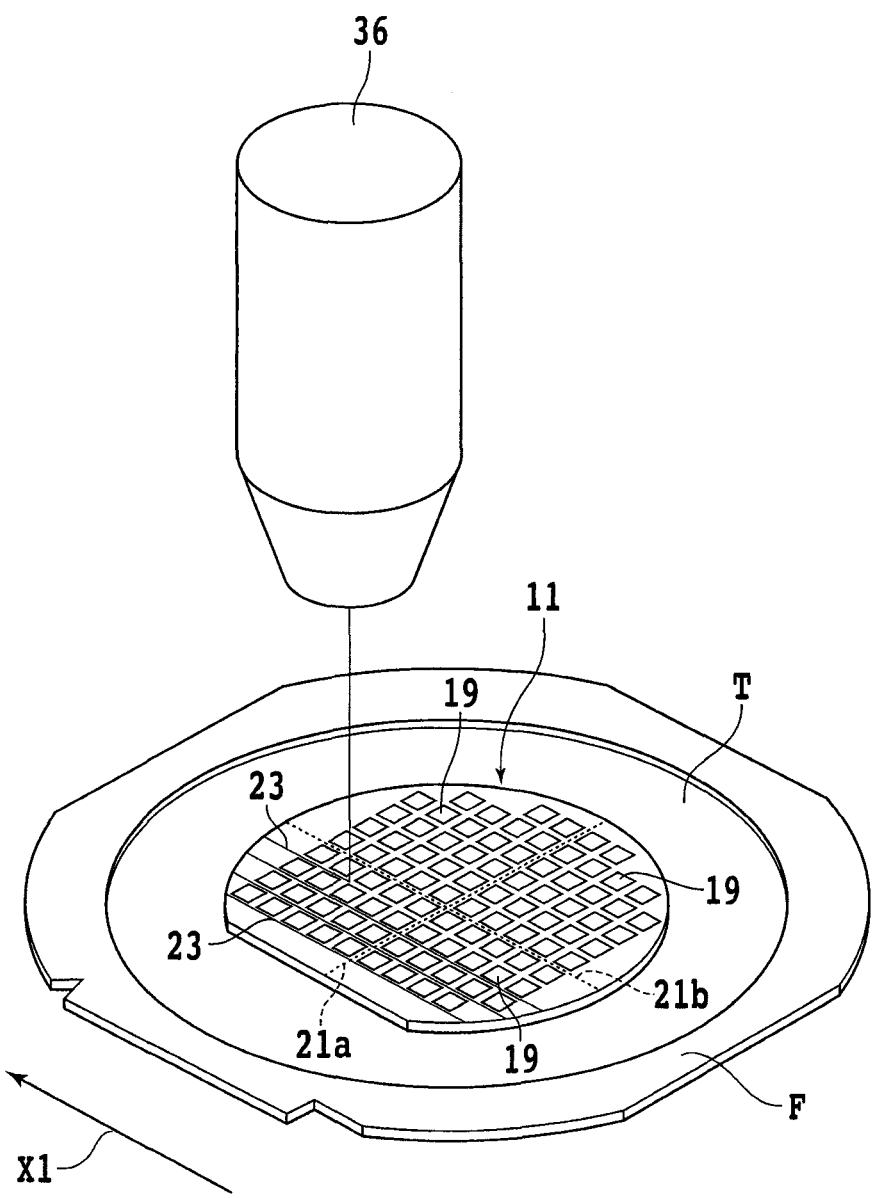
FIG. 5 is a perspective view illustrating a second dividing groove formation step.

After the first dividing groove formation step is carried out, a second dividing groove formation step of irradiating a laser beam of comparatively higher energy, that is, second energy higher than the first energy upon the other scheduled division lines 17 than the selected scheduled division lines 17 along which the first dividing grooves 21a and 21b are formed to form second dividing grooves to be used as start points of division. In particular, at the second dividing groove formation step, as seen in FIG. 5, a pulse laser beam which has comparatively high second energy and with regard to which the optical device wafer 11 has absorbency is irradiated upon a scheduled division line 17 extending in the first direction other than the selected scheduled division line 17 through the condenser 36, and the chuck table 28 is moved at a predetermined processing feed speed in the direction indicated by the arrow mark X1 to form a second dividing groove (laser processing groove) 23 along the scheduled division line 17 extending in the first direction.

While the chuck table 28 is index fed, similar second dividing grooves 23 are formed along all of the scheduled division lines 17 extending in the first direction other than the selected scheduled division line 17. Then, the chuck table 28 is rotated by 90 degrees, and a similar pulse laser beam is irradiated along all of the scheduled division lines 17 extending in the second direction other than the selected scheduled division line 17 to form the second dividing grooves (laser processing grooves) 23.

Figure 6:
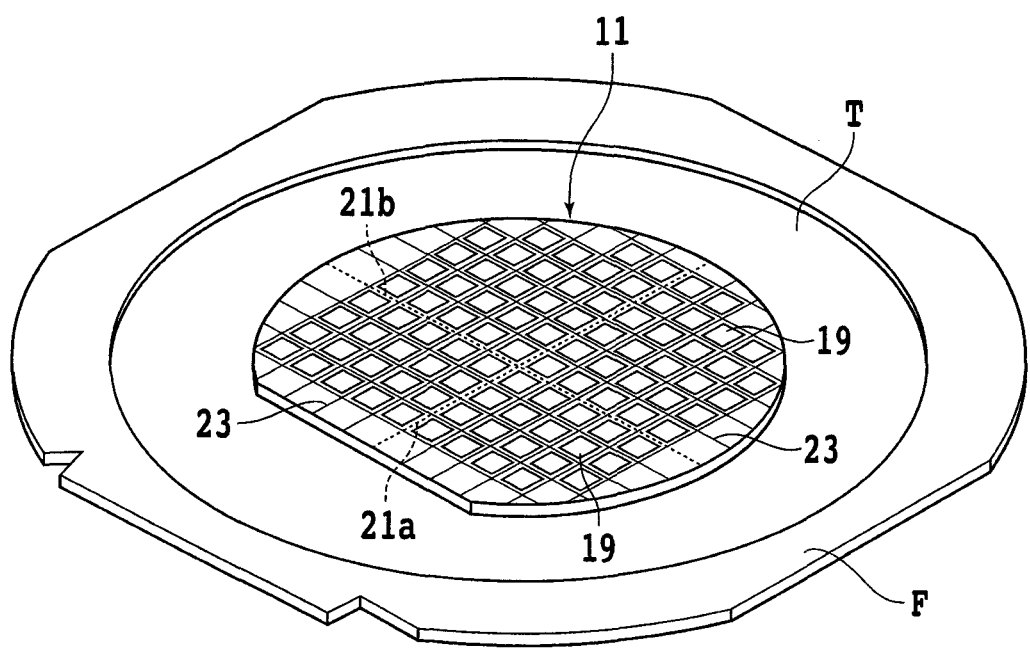
FIG. 6 is a perspective view of a wafer after the first and second dividing groove formation steps.

Referring to FIG. 6, there is shown a perspective view of the optical device wafer 11 in a state in which the first dividing grooves 21a and 21b are formed along the selected scheduled division lines 17 and the second dividing grooves 23 are formed along all of the other scheduled division lines 17.

Working Example 1

Laser processing was carried out for an optical device wafer having a diameter of 150 mm and a thickness of 100 μm in laser processing conditions given below.
(a) First Dividing Groove Formation Step

| | |
|---|---|
| Light source | YAG pulse laser |
| Wavelength | 355 nm (third harmonic wave of the YAG laser) |
| Average output | 0.5 W |
| Processing depth | 10 μm |
| Repetition frequency | 100 kHz |
| Spot diameter | 5 μm |
| Feed speed | 150 mm/s |

(b) Second Dividing Groove Formation Step

| | |
|---|---|
| Light source | YAG pulse laser |
| Wavelength | 355 nm (third harmonic wave of the YAG laser) |
| Average output | 1.5 W |
| Processing depth | 30 μm |
| Repetition frequency | 100 kHz |
| Spot diameter | 5 μm |
| Feed speed | 150 mm/s |

Working Example 2

Laser processing was carried out for an optical device wafer of the same conditions as those of the working example 1 in laser processing conditions given below.

(a) First Dividing Groove Formation Step

| | |
|---|---|
| Light source | YAG pulse laser |
| Wavelength | 355 nm (third harmonic wave of the YAG laser) |
| Average output | 1.5 W |
| Processing depth | 10 μm |
| Repetition frequency | 100 kHz |
| Spot diameter | 5 μm |
| Feed speed | 350 mm/s |

(b) Second Dividing Groove Formation Step

| | |
|---|---|
| Light source | YAG pulse laser |
| Wavelength | 355 nm (third harmonic wave of the YAG laser) |
| Average output | 1.5 W |
| Processing depth | 30 μm |
| Repetition frequency | 100 kHz |
| Spot diameter | 5 μm |
| Feed speed | 150 mm/s |

Figure 7:
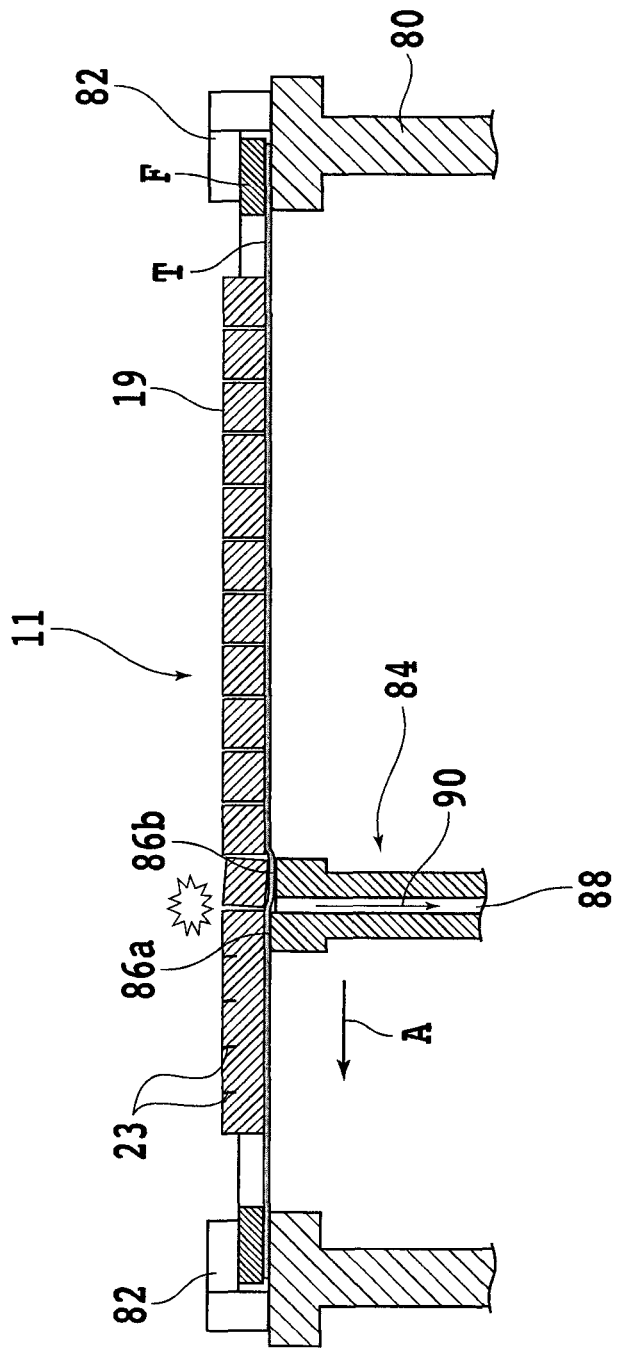
FIG. 7 is a sectional view illustrating a dividing step.

After the first dividing groove formation step and the second dividing groove formation step are carried out, the annular frame F on which the optical device wafer 11 is supported with the dicing tape T interposed therebetween is placed on a receiving face of a cylinder 80 and then clamped by the clamp 30 as seen in FIG. 7. Then, a dividing jig 84 of a bar shape is disposed into the cylinder 80. The dividing jig 84 has an upper stage holding face 86a and a lower stage holding face 86b, and a vacuum suction path 88 which is open to the lower stage holding face 86b is formed. A detailed structure of the dividing jig 84 is disclosed in Japanese Patent No. 4361506 and incorporated as a reference in the present specification.

In order to carry out a dividing step by the dividing jig 84, while the vacuum suction path 88 of the dividing jig 84 carries out vacuum suction as indicated by an arrow mark 90, the upper stage holding face 86a and the lower stage holding face 86b of the dividing jig 84 are brought into contact with the dicing tape T from below and the dividing jig 84 is moved in a direction indicated by an arrow mark A. In other words, the dividing jig 84 is moved in a direction perpendicular to the scheduled division line 17 along which division is to be carried out. When one of the second dividing grooves 23 comes to a position just above an inner side edge of the upper stage holding face 86a of the dividing jig 84 as a result of the movement, then bending stress is generated in a concentrated manner at the position of the scheduled division line 17 which has the second dividing groove 23, and the optical device wafer 11 is cut along the scheduled division line 17 by this bending stress.

The first dividing groove 21a formed along the selected scheduled division line 17 extending in the first direction has a processing depth of about 10 μm and is shallow in comparison with the processing depth of 30 μm of the second dividing grooves 23. However, when the first dividing groove 21a comes to a position just above the inner side edge of the upper stage holding face 86a of the dividing jig 84, bending stress is generated in a concentrated manner at the position of the scheduled division line 17 having the first dividing groove 21a, and the optical device wafer 11 can be cut along the scheduled division line 17 by this bending stress. While the dividing jig 84 is moved in the direction indicated by the arrow mark A, the optical device wafer 11 is divided along all of the scheduled division lines 17 extending in the first direction. Thereafter, the dividing jig 84 is rotated by 90 degrees, or the cylinder 80 is rotated by 90 degrees, and the scheduled division lines 17 extending in the second direction perpendicular to the scheduled division lines 17 extending in the first direction are divided similarly.

With the embodiment described above, a laser beam of comparatively low energy is irradiated along the selected scheduled division lines 17 to form the first dividing grooves 21a and 21b to be used as start points of division, and another laser beam of comparatively high energy is irradiated upon the scheduled division lines 17 other than the selected scheduled division lines to form the second dividing grooves 23 to be used as start points of division. Therefore, after the first and second dividing grooves 21a, 21b and 23 are formed on the optical device wafer 11 of such a large size as a diameter of approximately 150 mm, when the optical device wafer 11 is carried out from the laser processing apparatus, or when the optical device wafer 11 is transported to the dividing apparatus, the optical device wafer 11 can be prevented from being broken.

While, in the embodiment described above, an example is described in which the processing method of the present invention is applied to the optical device wafer 11, the application of the processing method of the present invention is not limited to the optical device wafer 11. The processing method can be applied similarly also to an ordinary semiconductor wafer formed from silicon, a compound semiconductor wafer and so forth. While, in the embodiment described above, the first dividing groove formation step and the second dividing groove formation step are carried out by irradiating a laser beam on the front face 11a side of the optical device wafer 11, a laser beam may otherwise be irradiated from the reverse face 11b side of the optical device wafer 11 to form the first dividing grooves 21a and 21b and the second driving grooves 23 on the reverse face 11b.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing method for a wafer, having a surface on which a plurality of devices are formed and partitioned by scheduled division lines, comprising:
    a dividing groove formation step of irradiating a laser beam of a wavelength with regard to which the wafer has absorbency along the scheduled division lines to form dividing grooves which are to be used as start points of division; and
    a dividing step of applying external force to the wafer on which the plural dividing grooves are formed to divide the wafer into individual devices;
    wherein the dividing groove formation step includes
        a scheduled division line selection step of selecting a scheduled division line which partitions the plural devices as a block,
        a first dividing groove formation step of irradiating a laser beam of first energy which is comparatively low upon the selected scheduled division line to form a first dividing groove which is to be used as a start point of division, and
        a second dividing groove formation step of irradiating another laser beam of second energy which is higher than the first energy upon scheduled division lines other than the selected scheduled division line to form second dividing grooves which are to be used as start points of division.

2. The processing method for the wafer according to claim 1, wherein, at the second dividing groove formation step, the second dividing grooves are formed avoiding the first dividing groove.

* * * * *